(12) United States Patent
Bangar et al.

(10) Patent No.: US 9,864,280 B2
(45) Date of Patent: Jan. 9, 2018

(54) OVERLAY ERROR CORRECTION

(71) Applicant: Applied Materials Inc., Santa Clara, CA (US)

(72) Inventors: Mangesh Bangar, San Jose, CA (US); Bruce E. Adams, Portland, OR (US); Kelly E. Hollar, Sunnyvale, CA (US); Abhilash J Mayur, Salinas, CA (US); Huixiong Dai, San Jose, CA (US); Jaujiun Chen, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 185 days.

(21) Appl. No.: 14/874,353

(22) Filed: Oct. 2, 2015

(65) Prior Publication Data
US 2017/0097576 A1    Apr. 6, 2017

(51) Int. Cl.
*G06F 7/20* (2006.01)
*G03F 9/00* (2006.01)
*G03F 7/20* (2006.01)

(52) U.S. Cl.
CPC .............. *G03F 7/70633* (2013.01)

(58) Field of Classification Search
CPC ................................... G03F 7/70633
USPC .................................... 430/22, 30
See application file for complete search history.

(56) References Cited

U.S. PATENT DOCUMENTS

| 7,433,051 B2 | 10/2008 | Owen |
| 8,956,885 B2 | 2/2015 | Barash et al. |
| 2002/0071994 A1 | 6/2002 | Shimazu et al. |
| 2011/0249247 A1 | 10/2011 | Cramer et al. |
| 2013/0089935 A1 | 4/2013 | Vukkadala et al. |
| 2014/0356982 A1 | 12/2014 | Barash et al. |

FOREIGN PATENT DOCUMENTS

| EP | 1601931 B1 | 4/2011 |
| WO | WO 2013-189724 A2 | 12/2013 |

OTHER PUBLICATIONS

PCT International Search Report and the Written Opinion for counterpart PCT Appln. No. PCT/US2016/053191, dated Jan. 5, 2017, 14 pages.
Brunner, Timothy A. et al., "Characterization of wafer geometry an overlay error on silicon wafers with nonuniform stress," Journal of Micro/Nanolithography, MEMS, and MOEMS (Oct.-Dec. 2013) vol. 12(4), 13 pages.
Sharoni, Ofir et al., Intra-field On-Product Overlay improvement by application of RegC® and TWINSCAN™ corrections, 11 pages.
Shetty, Shrinivas, "Impact of Laser Spike Annealing Dwell Time on Wafer Stress and Photolithography Overlay Errors," Ext. Abs. the 9th International Workshop on Junction Technology 2009, pp. 119-122.
Graitzer, Erez, "Correcting Image Placement Error Using Registration Control (RegC) Technology," Optical Microlithogrphy XXIV, edited by Mircea V. Dusa, Proc. of SPIE vol. 7973, 2011 pp. 797312-1-9.
Turner, Kevin T. et al., "Relationship between localized wafer shape changes induced by residual stress and overlay errors," Journal of Micro/Nanolithography, MEMS, and MOEMS (Jan.-Mar.) vol. 11(1), 9 pages.
Lee, Honggoo et al., "Improvement of Process Control using Wafer Geometry for Enhanced Manufacturability of Advanced Semiconductor Devices" Optical Microlithogrphy XXIV, edited by Jason P. Cain, Proc. of SPIE vol. 9424, 2015 pp. 94240M-9.

*Primary Examiner* — Christopher G Young
(74) *Attorney, Agent, or Firm* — Schwabe, Williamson & Wyatt, P.C.

(57) ABSTRACT

A calibration curve for a wafer comprising a layer on a substrate is determined. The calibration curve represents a local parameter change as a function of a treatment parameter associated with a wafer exposure to a light. The local parameter of the wafer is measured. An overlay error is determined based on the local parameter of the wafer. A treatment map is computed based on the calibration curve to correct the overlay error for the wafer. The treatment map represents the treatment parameter as a function of a location on the wafer.

16 Claims, 10 Drawing Sheets

```
                                                                           100
┌─────────────────────────────────────────────────────────────────┐
│ DETERMINE A CALIBRATION CURVE FOR A WAFER COMPRISING A FIRST    │
│ LAYER ON A SUBSTRATE, THE CALIBRATION CURVE REPRESENTING A      │
│ LOCAL STRESS PARAMETER CHANGE AS A FUNCTION OF A TREATMENT      │
│ PARAMETER ASSOCIATED WITH A WAFER EXPOSURE TO A LIGHT           │
│                             101                                 │
└─────────────────────────────────────────────────────────────────┘
                                    │
                                    ▼
┌─────────────────────────────────────────────────────────────────┐
│          MEASURE THE LOCAL STRESS PARAMETER OF THE WAFER        │
│                             102                                 │
└─────────────────────────────────────────────────────────────────┘
                                    │
                                    ▼
┌─────────────────────────────────────────────────────────────────┐
│        DETERMINE AN OVERLAY ERROR BASED ON THE LOCAL STRESS     │
│                           PARAMETER                             │
│                             103                                 │
└─────────────────────────────────────────────────────────────────┘
                                    │
                                    ▼
┌─────────────────────────────────────────────────────────────────┐
│ COMPUTE A TREATMENT MAP BASED ON THE CALIBRATION CURVE TO       │
│ CORRECT THE OVERLAY ERROR FOR THE WAFER, THE TREATMENT MAP      │
│ REPRESENTING THE TREATMENT PARAMETER AS A FUNCTION OF A         │
│                    LOCATION ON THE WAFER                        │
│                             104                                 │
└─────────────────────────────────────────────────────────────────┘
                                    │
                                    ▼
┌─────────────────────────────────────────────────────────────────┐
│      PROCESS THE WAFER BY CONTROLLING THE FIRST TREATMENT       │
│            PARAMETER USING THE FIRST TREATMENT MAP              │
│                             105                                 │
└─────────────────────────────────────────────────────────────────┘
                                    │
                                    ▼
┌─────────────────────────────────────────────────────────────────┐
│        RE-MEASURE THE LOCAL PARAMETER OF THE FIRST WAFER        │◄──┐
│                             106                                 │   │
└─────────────────────────────────────────────────────────────────┘   │
                                    │                                 │
                                    ▼                                 │
┌─────────────────────────────────────────────────────────────────┐   │
│    DETERMINE A SECOND OVERLAY ERROR BASED ON THE RE-MEASURED    │   │
│                         LOCAL PARAMETER                         │   │
│                             107                                 │   │
└─────────────────────────────────────────────────────────────────┘   │
                                    │                                 │
                     NO             ▼                                 │
     ╔═══════╗           ◇ IS TE SECOND ◇                             │
     ║  END  ║◄──────── OVERLAY ERROR GREATER THAN                    │
     ║  111  ║           A PREDETERMINED THRESHOLD?                   │
     ╚═══════╝                     108                                │
                                    │ YES                             │
                                    ▼                                 │
┌─────────────────────────────────────────────────────────────────┐   │
│   COMPUTE A SECOND TREATMENT MAP FOR THE WAFER BASED ON THE     │   │
│                      SECOND OVERLAY ERROR                       │   │
│                             109                                 │   │
└─────────────────────────────────────────────────────────────────┘   │
                                    │                                 │
                                    ▼                                 │
┌─────────────────────────────────────────────────────────────────┐   │
│      PROCESS THE WAFER BY CONTROLLING THE FIRST TREATMENT       │   │
│           PARAMETER USING THE SECOND TREATMENT MAP              │───┘
│                             110                                 │
└─────────────────────────────────────────────────────────────────┘
```

OVERLAY ERROR CORRECTION

FIELD

Embodiments of the present invention pertain to the field of electronic device manufacturing, and in particular, to an overlay error correction.

BACKGROUND

Current electronic device manufacturing involves depositing layers of patterned materials on a substrate to fabricate transistors, contacts, and other devices. For proper operation of the device, these patterned layers for example contacts, lines and transistor features need to be aligned. Generally, an overlay control is defined as a control of the alignment of a patterned layer to one or more underlying patterned layers for a multilayer device structure. Typically, an overlay error represents a misalignment between the patterned layers.

The misalignment between the patterned layers can cause short circuits and connection failures that impact manufacturing yield and cost. Generally, as the device features decrease and pattern density increases, overlay error budgets shrink. Conventional multi-exposure and multi-patterning schemes require very tight overlay error budgets. In conventional lithographic systems, various alignment mechanisms are provided to align features in a given layer to the features in a underlying layer. For advanced nodes, however, optical or extreme ultraviolet (EUV) scanner improvements alone does not reduce the overlay error enough to meet the required specifications. A process related overlay error has become a significant part (about 50%) of the overall overlay budget. Typically, the overlay error reduces the device performance, yield and throughput significantly. Additionally, a stress related process induced overlay error significantly impacts high volume production (HVP) of logic and memory devices.

SUMMARY

Methods and apparatuses to provide light induced overlay error correction are described. In one embodiment, a calibration curve for a wafer comprising a layer on a substrate is determined. The calibration curve represents a local parameter change as a function of a treatment parameter associated with a wafer exposure to a light. The local parameter of the wafer is measured. An overlay error is determined based on the local parameter of the wafer. A treatment map is computed based on the calibration curve to correct the overlay error for the wafer. The treatment map represents the treatment parameter as a function of a location on the wafer.

In one embodiment, a non-transitory machine readable medium comprises instructions that cause a data processing system to perform operations comprising determining a calibration curve for a wafer comprising a layer on a substrate, wherein the calibration curve represents a local parameter change as a function of a treatment parameter associated with a wafer exposure to a light; measuring the local parameter of the wafer; determining an overlay error based on the local parameter; and computing a treatment map based on the calibration curve to correct the overlay error for the wafer, wherein the treatment map represents the treatment parameter as a function of a location on the wafer.

In one embodiment, a system to manufacture an electronic device, comprises a processing chamber. A processor is coupled to the processing chamber. A memory is coupled to the processor. The processor has a configuration to control determining a calibration curve for a wafer. The processor has a configuration to control measuring the local parameter of the wafer. The processor has a configuration to control determining an overlay error based on the local parameter. The processor has a configuration to control computing a treatment map based on the calibration curve to correct the overlay error for the wafer.

Other features of the embodiments of the present invention will be apparent from the accompanying drawings and from the detailed description which follows.

BRIEF DESCRIPTION OF THE DRAWINGS

The embodiments as described herein are illustrated by way of example and not limitation in the figures of the accompanying drawings in which like references indicate similar elements.

DETAILED DESCRIPTION

Methods and apparatuses to correct an overlay error using light are described. A calibration curve for a wafer is determined. The wafer comprises one or more layers on a substrate. The calibration curve represents a change of the local parameter of the wafer as a function of a treatment parameter associated with the wafer exposure to a light. The local parameter of the wafer is measured. An overlay error is determined based on the local parameter. A treatment map is computed based on the calibration curve. The treatment map is to correct the overlay error for the wafer. The treatment map represents the treatment parameter as a function of a location on the wafer.

In one embodiment, a laser induced stress change is used to decrease process related overlay errors. A process induced overlay error is correlated with a process related stress non-uniformity of a wafer. Typically, the process related stress non-uniformity of the wafer is defined as being generated at a wafer processing operation, e.g., a mechanical, chemical, thermal, etch, deposition, or other wafer processing operation.

In one embodiment, the wafer comprises a film or a multilayer stack. In one embodiment, the overlay error is reduced by reducing the process related non-uniformity of the wafer using a laser annealing technique. This technique relies on the knowledge of the wafer properties and the wafer response to the annealing conditions. The light delivered to the film or stack is precisely controlled using spatial, temporal and dose control tools.

Embodiments of the light induced overlay error correction described herein advantageously reduce a process related overlay error up to about 90%. In at least some embodiments, the light induced overlay error correction provides an advantage of relaxing specifications for lithography tools that result in production gain compared to conventional techniques that require exhaustive overlay measurements. In at least some embodiments, a global stress or bow of the wafer is reduced by a light that improves wafer handling and acceptance on different processing tools e.g., electrostatic chucks (ESC), lithography tools, or other processing tools. In at least some embodiments, reducing a global stress of the wafer, a local stress non-uniformity of the wafer, or both by a light improves structural integrity of etched patterns.

In at least some embodiments, different wavelengths of the light and different light processing conditions are advantageously used to correct overlay errors for different films, stacks or process flows. In at least some embodiments, the light induced overlay error correction technique is a highly flexible technique that provides different exposure setups to increase manufacturing throughput. In at least some embodiments, the light induced overlay error correction technique improves wafer-to-wafer, lot-to-lot and chamber-to-chamber matching in terms of overlay performance, as described in further detail below.

In the following description, numerous specific details, such as specific materials, chemistries, dimensions of the elements, etc. are set forth in order to provide thorough understanding of one or more of the embodiments of the present invention. It will be apparent, however, to one of ordinary skill in the art that the one or more embodiments of the present invention may be practiced without these specific details. In other instances, semiconductor fabrication processes, techniques, materials, equipment, etc., have not been described in great details to avoid unnecessarily obscuring of this description. Those of ordinary skill in the art, with the included description, will be able to implement appropriate functionality without undue experimentation.

While certain exemplary embodiments of the invention are described and shown in the accompanying drawings, it is to be understood that such embodiments are merely illustrative and not restrictive of the current invention, and that this invention is not restricted to the specific constructions and arrangements shown and described because modifications may occur to those ordinarily skilled in the art.

Reference throughout the specification to "one embodiment", "another embodiment", or "an embodiment" means that a particular feature, structure, or characteristic described in connection with the embodiment is included in at least one embodiment of the present invention. Thus, the appearance of the phrases "in one embodiment" or "in an embodiment" in various places throughout the specification are not necessarily all referring to the same embodiment. Furthermore, the particular features, structures, or characteristics may be combined in any suitable manner in one or more embodiments.

Moreover, inventive aspects lie in less than all the features of a single disclosed embodiment. Thus, the claims following the Detailed Description are hereby expressly incorporated into this Detailed Description, with each claim standing on its own as a separate embodiment of this invention. While the invention has been described in terms of several embodiments, those skilled in the art will recognize that the invention is not limited to the embodiments described, but can be practiced with modification and alteration within the spirit and scope of the appended claims. The description is thus to be regarded as illustrative rather than limiting.

Figure 1:
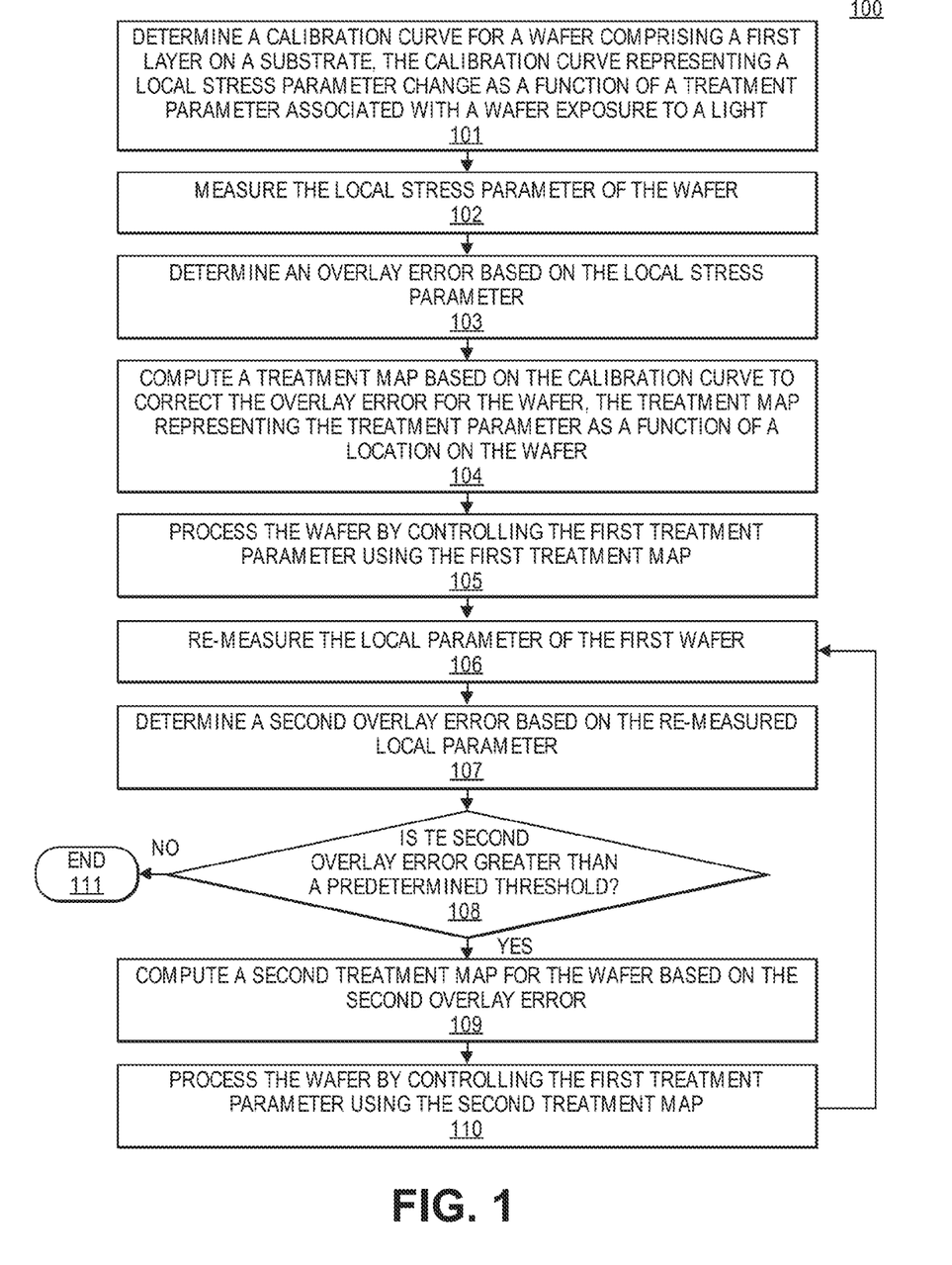
FIG. 1 is a flowchart of a method to correct an overlay error according to one embodiment.

FIG. 1 is a flowchart of a method 100 to correct an overlay error according to one embodiment. At block 101 a calibration curve for an incoming wafer is determined. In one embodiment, the calibration curve for the wafer is determined based on one or more wafer characteristics, as described in further detail below. In one embodiment, the wafer comprises one or more layers on a substrate. The calibration curve represents a change of the local parameter of the wafer as a function of a treatment parameter associated with the wafer exposure to a light. In one embodiment, the local parameter comprises a local stress curvature. In one embodiment, the treatment parameter comprises a light power, a light fluence, a light pulse width, a light beam shape, a light beam size, a light wavelength, a light exposure repetition rate, a light exposure time, a light scan speed, a number of light flashes, a light zone temperature, an ambient condition, a light exposure mode, a light exposure sequence, a light exposure pattern, or any combination thereof, as described in further detail below.

Figure 2:
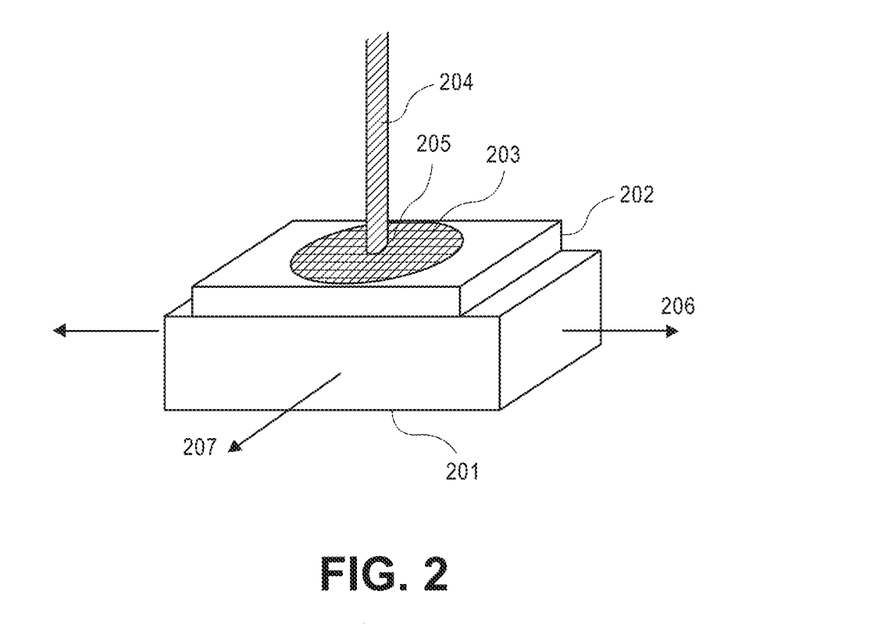
FIG. 2 is a view illustrating an exposure of a wafer to a light according to one embodiment.

FIG. 2 is a view 200 illustrating an exposure of a wafer 203 to a light 204 according to one embodiment. As shown in FIG. 2, wafer 203 is placed on a wafer holder 202 on a movable pedestal 201. In one embodiment, movable pedestal 201 comprises an electrostatic chuck ("ESC"), or other movable pedestal known to one of ordinary skill in the art of electronic device manufacturing. In alternative embodiments, pedestal 202, light 204, or both are moved along a plurality of axes, e.g., an X axis 206 and an Y axis 207 to expose local portions of the wafer 203 to light 204. In one embodiment, wafer holder 202 is any wafer holder known to one of ordinary skill in the art of electronic device manufacturing.

In one embodiment, light 204 is supplied from a light source (not shown) to induce annealing at a predetermined location 205 on wafer 203. In one embodiment, light 204 is a coherent light beam generated by a coherent light source, e.g., a laser. In another embodiment, light 204 is an incoherent light generated by a incoherent light source, e.g., one or more light bulbs, one or more light emitting diodes, or other incoherent light sources. In one embodiment, the wafer 203 comprises a mask layer on a front side of a substrate. In another embodiment, the wafer 203 comprises a backside layer on a back side of the substrate. In yet another embodiment, the wafer 203 comprises a mask layer deposited on the front side of the substrate and a backside layer deposited on the back side of the substrate, as described in further detail below with respect to FIG. 3. In one embodiment, the substrate of the wafer 203 comprises a multilayer stack including conducting, semiconducting, insulating, or any combination thereof layers deposited on top of one another.

In an embodiment, the substrate of the wafer 203 comprises a semiconductor material, e.g., silicon (Si). In one embodiment, the substrate is a monocrystalline Si substrate. In another embodiment, the substrate is a polycrystalline silicon substrate. In another embodiment, the substrate represents a previous interconnect layer. In yet another embodiment, the substrate is an amorphous silicon substrate. In alternative embodiments, the substrate includes silicon, germanium ("Ge"), silicon germanium ("SiGe"), a III-V materials based material e.g., gallium arsenide ("GaAs"), or any combination thereof. In one embodiment, the substrate includes metallization interconnect layers for integrated circuits. In an embodiment, the substrate is a semiconductor-on-isolator (SOI) substrate including a bulk lower substrate, a middle insulation layer, and a top monocrystalline layer. The top monocrystalline layer may comprise any material listed above, e.g., silicon. In various implementations, the substrate can be, e.g., an organic, a ceramic, a glass, or a semiconductor substrate. In one implementation, the semiconductor substrate may be a crystalline substrate formed using a bulk silicon or a silicon-on-insulator substructure. In other implementations, the semiconductor substrate may be formed using alternate materials, which may or may not be combined with silicon, that include but are not limited to germanium, indium antimonide, lead telluride, indium arsenide, indium phosphide, gallium arsenide, indium gallium arsenide, gallium antimonide, or other combinations of group III-V or group IV materials.

In at least some embodiments, the substrate comprises any material to make any of integrated circuits, passive (e.g., capacitors, inductors) and active (e.g., transistors, photo detectors, lasers, diodes) microelectronic devices. The substrate may include insulating (e.g., dielectric) materials that separate such active and passive microelectronic devices from a conducting layer or layers that are formed on top of them e.g., silicon dioxide, silicon nitride, sapphire, other dielectric materials, or any combination thereof. Although a few examples of materials from which the substrate may be formed are described here, any material that may serve as a foundation upon which passive and active electronic devices (e.g., transistors, memories, capacitors, inductors, resistors, switches, integrated circuits, amplifiers, optoelectronic devices, or any other electronic devices) may be built falls within the spirit and scope of the embodiments described herein.

In one embodiment, the mask layer of wafer 203 comprises a hard mask layer. In another embodiment, the mask layer of wafer 203 comprises a photoresist layer. In an embodiment, the mask layer of the wafer 203 is an organic hard mask layer comprising carbon. In an embodiment, the mask layer of the wafer 203 is an amorphous carbon layer (ACL), a nitride layer e.g., silicon nitride, silicon oxide nitride, or other nitride layer, an oxide layer e.g., a silicon oxide, a titanium oxide, or other oxide layer. In one embodiment, the ACL of the wafer 203 is doped with a chemical element (e.g., boron, silicon, aluminum, gallium, indium, or other chemical element). In one embodiment, the backside layer of the wafer 203 is an oxide, a nitride, a carbide, other backside film, or any combination thereof.

In one embodiment, the light 204 is supplied to a local portion on the mask layer of the wafer 204. In another embodiment, the light 204 is supplied to a local portion of the backside film of the wafer 204. In yet another embodiment, the light 204 is supplied to a local portion of the mask layer of the wafer 203 and to a local portion of the backside layer of the wafer 203, as described in further detail below.

Figure 3:
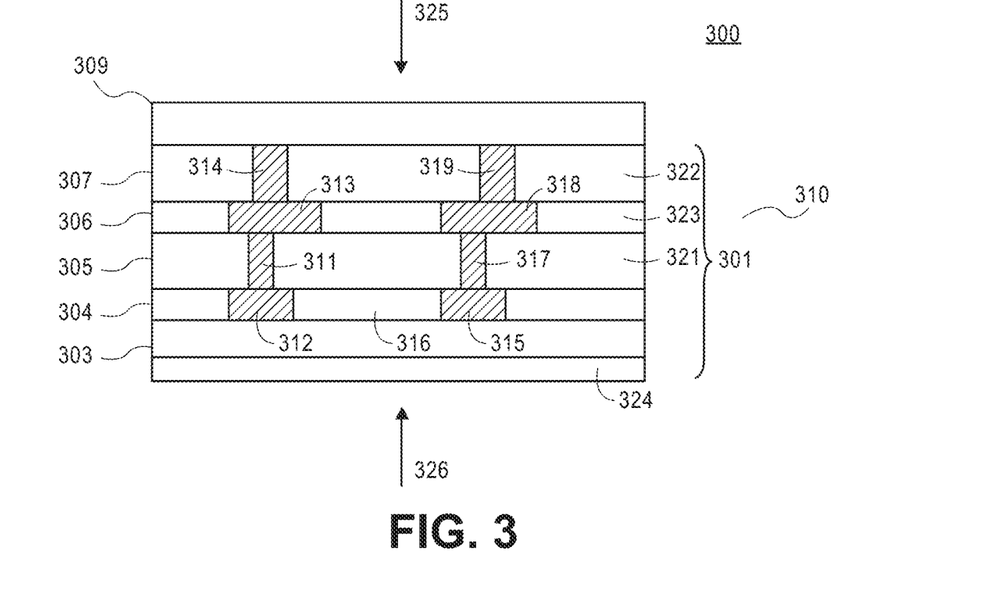
FIG. 3 is a side view of a wafer according to one embodiment.

FIG. 3 is a side view 300 of a wafer 310 according to one embodiment. As shown in FIG. 3, wafer 310 comprises a mask layer 302 on a top side of a substrate 301. As shown in FIG. 3, a backside layer 324 is deposited on a bottom side of the substrate 301. As shown in FIG. 3, substrate 301 comprises an interconnect layer 307 on a metallization (M) layer 306 on an interconnect layer 305 on a device layer 304 on a substrate 303. In one embodiment, substrate 303 represents one of the substrates described above with respect to FIG. 2. In another embodiment, substrate 301 represents one of the substrates described above with respect to FIG. 2. In one embodiment, mask layer 309 represents one of the mask layers described with respect to FIG. 2. In one embodiment, backside layer 324 represents one of the backside layers described above with respect to FIG. 2.

As shown in FIG. 3, the device layer 304 includes one or more electronic devices features, e.g., a device feature 312 and a device feature 315 formed on an electrically insulating layer 316. In alternative embodiments, the device features 312 and 315 represent features of transistors, memories, capacitors, resistors, optoelectronic devices, switches, or any other active and passive electronic devices features. As shown in FIG. 3, interconnect layer 305 comprises conductive interconnects 311 and 317 formed on an insulating layer 321. Interconnect layer 307 comprises conductive interconnects 314 and 319 on an insulating layer 322. In one embodiment, the conductive interconnects are conductive vias, or other interconnects. Metallization layer 306 comprises conductive lines 313 and 318 formed on an insulating layer 323. Interconnect 311 connects device feature 312 to conductive line 313.

Interconnect 314 connects conductive line 313 to an upper metallization layer (not shown). Each of the insulating layers 316, 321, 322 and 323 can be for example, an interlayer dielectric, a trench insulation layer, or any other electrically insulating layer known to one of ordinary skill in the art of the electronic device manufacturing. In alternative embodiments, device layer 304 includes polyimide, epoxy, photodefinable materials, such as benzocyclobutene (BCB), and WPR-series materials, or spin-on-glass. In an embodiment, the features of the device layer, metallization layer, and interconnect layers of the substrate 301 comprise a metal, for example, copper (Cu), aluminum (Al), indium (In), tin (Sn), lead (Pb), silver (Ag), antimony (Sb), bismuth (Bi), zinc (Zn), cadmium (Cd), gold (Au), ruthenium (Ru), nickel (Ni), cobalt (Co), chromium (Cr), iron (Fe), manganese (Mn), titanium (Ti), hafnium (Hf), tantalum (Ta), tungsten (W), vanadium (V), molybdenum (Mo), palladium (Pd), gold (Au), platinum (Pt), polysilicon, other electrically conductive material known to one of ordinary skill in the art of electronic device manufacturing, or any combination thereof.

In one embodiment, the thickness of the mask layer 309 is enough to substantially absorb and prevent the light 326 from being propagated into the substrate 301. In one embodiment, light 325 represents light 204, or a portion thereof. In one embodiment, a wavelength of the light 325 is selected to maximize absorption in the mask layer 309 to avoid propagation of the light 326 into substrate 301. In an embodiment, the thickness of the mask layer is from about 2 nm to about 5 μm. Mask layer 309 can be deposited using one of a mask layer deposition techniques, such as but not limited to a spin coating, a sputtering, a chemical vapour deposition ("CVD"), e.g., a Plasma Enhanced Chemical Vapour Deposition ("PECVD"), a physical vapour deposition ("PVD"), molecular beam epitaxy ("MBE"), metalorganic chemical vapor deposition ("MOCVD"), atomic layer deposition ("ALD"), or other mask layer deposition techniques known to one of ordinary skill in the art of electronic device manufacturing.

In one embodiment, the thickness of the backside layer 324 is enough to substantially absorb and prevent the light 326 from being propagated into the substrate 301. In one embodiment, a wavelength of the light 326 is selected to maximize absorption in the backside layer 324 to avoid propagation of the light 326 into substrate 301. In one embodiment, light 326 represents light 204, or a portion thereof. In an embodiment, the thickness of the backside layer 324 is from about 2 nm to about 5 μm. Backside layer 324 can be deposited using one of a backside layer deposition techniques, such as but not limited to a spin coating, a sputtering, a chemical vapour deposition ("CVD"), e.g., a Plasma Enhanced Chemical Vapour Deposition ("PECVD"), a physical vapour deposition ("PVD"), molecular beam epitaxy ("MBE"), metalorganic chemical vapor deposition ("MOCVD"), atomic layer deposition ("ALD"), or other mask layer deposition techniques known to one of ordinary skill in the art of electronic device manufacturing.

Figure 4:
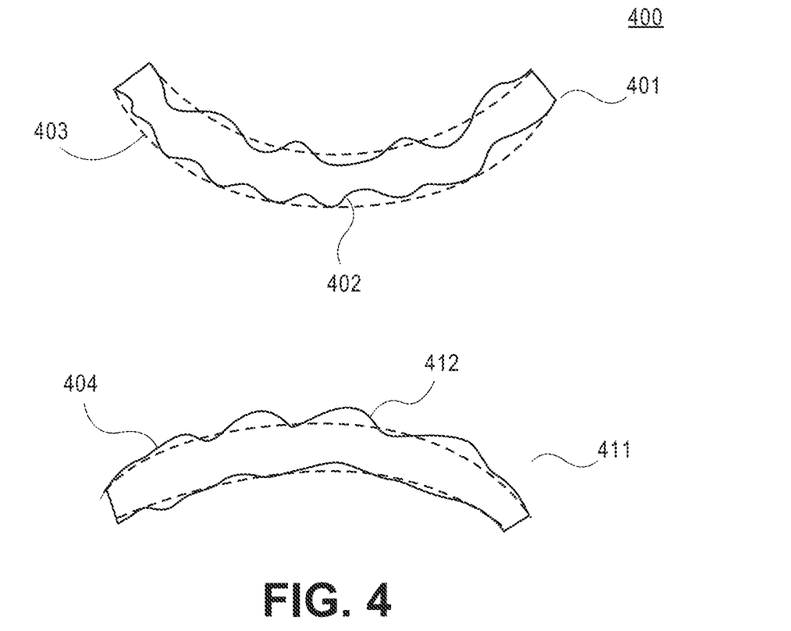
FIG. 4 is a side view illustrating variations of a local curvature of the wafer according to one embodiment.

FIG. 4 is a side view 400 illustrating variations of a local curvature of the wafer according to one embodiment. As shown in FIG. 4, a wafer 401 has a global curvature 403 that is substantially uniform along the wafer. A wafer 411 has a global curvature 404 that is substantially uniform along the wafer. In one embodiment, each of the wafers 401 and 411 represents one of the wafer 203 or wafer 310. Global curvature 403 has a radius that is substantially constant along the wafer 401. Global curvature 404 has a radius that is substantially constant along the wafer 411. Typically, the global curvature is associated with a global stress of the wafer.

Wafer 401 has a local curvature 402 that varies along the wafer. Wafer 411 has a local curvature 412 that varies along the wafer. Generally, the variation of the curvature from one location to another location on the wafer is associated with a local variation of the stress of the wafer. Typically, non-uniform local stress of the wafer causes a process related non-correctable lithography overlay error and device yield loss. In one embodiment, an overlay error is associated with local variations of the stress curvature of the wafer. In one embodiment, the local variations of the stress curvature are reduced by light to correct the overlay error of the wafer, as described in further detail below.

Figure 5:
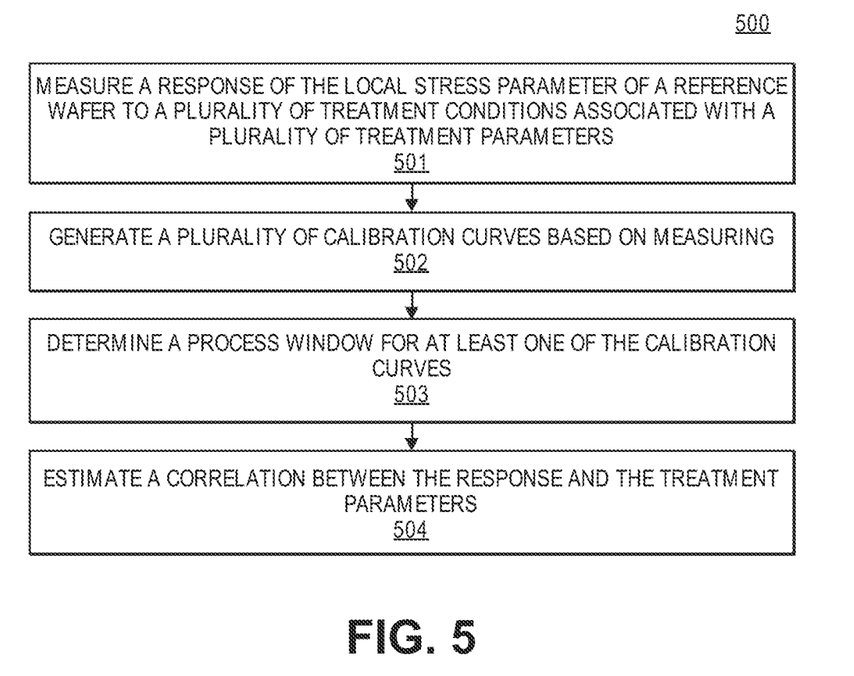
FIG. 5 is a flowchart of a method to determine a calibration curve according to one embodiment.

FIG. 5 is a flowchart of a method 500 to determine a calibration curve according to one embodiment. At a block 501 a response of the local stress parameter of one or more reference wafers to a plurality of treatment conditions is measured. In at least some embodiments, the plurality of treatment conditions are characterized by a plurality of treatment parameters associated with exposure of the wafer to the light. In one embodiment, the treatment parameter with exposure of the wafer to the light controls the local annealing temperature of the wafer.

In one embodiment, the treatment parameters comprise e.g., a dose, a power, a fluence, a pulse width, a beam shape, a beam size, a wavelength, an exposure repetition rate, an exposure time, a scan speed, a number of flashes, a zone temperature, an ambient condition, an exposure mode, an exposure sequence, an exposure pattern, or any combination thereof.

In one embodiment, the light incident to the wafer is a laser light having the beam size from about few microns to about few centimeters. In more specific embodiment, the laser beam size is about 25 microns. In one embodiment, the laser light wavelength is from near ultraviolet (UV) wavelength to infrared (IR) wavelength. In more specific embodiment, the wavelength of the light is about 532 nm. In one embodiment, the laser repetition rate is from about few hertz (Hz) to about 100s of KiloHertz (KHz). In one embodiment, the laser fluence range is from few microjoules per square centimeter ($\mu J/cm^2$) to about few joules per square centimeter ($J/cm^2$). In one embodiment, an exposure time of the wafer to the light is from about few nanosecond (nS) to about few seconds.

In one embodiment, the light pulse width determines the exposure time. In one embodiment, the laser beam shape determines a gradient of the local annealing temperature on the wafer. In one embodiment, the laser beam shape is Gaussian, asymmetric Gaussian, trail-ending Gaussian, trail-leading Gaussian, square, triangular, saw-tooth, trail-ending triangular, trail-leading triangular, or any other laser beam shape. In alternative embodiments, an ambient condition at which the wafer is exposed to the light is an atmospheric (e.g., air), an inert gas, or a vacuum condition. In one embodiment, the wafer exposed to the light is heated at a temperature greater than a room temperature. In alternative embodiments, a wafer exposure mode is a full wafer single exposure mode (in a flash), a continuous (scan mode), or discontinuous (ON and OFF) mode. In one embodiment, single or multiple exposures on a wafer are used to correct the overlay error. In one embodiment, an exposure sequence pattern is used to precisely control exposure to the light to correct the overlay error.

In one embodiment, a single laser beam is expanded e.g., using optics to provide a full wafer single exposure to the light. In another embodiment, multiple laser beams having a combined beam diameter substantially equal to the wafer diameter with stitching is used to control an exposure of the wafer to the light (e.g., location dependent dose delivery). In another embodiment, for a single exposure a plurality of flash bulbs are used to provide a single exposure of the wafer to the light. In one embodiment, the treatment parameter, e.g., the fluence, power, exposure time or combination thereof of the light output by the flash bulbs are controlled to provide a location dependent light delivery. In one embodiment, the flash bulbs are halogen bulbs.

At block 502 one or more stress correction calibration curves are generated based on measuring of the responses of the one or more reference wafers. In one embodiment, the one or more calibration curves are stored in a memory. At block 503 a process window for at least one of the calibration curves is determined. In one embodiment, a dependence of the treatment towards the wafer characteristics, e.g., the film thickness, optical, thermal properties, deposition conditions, and other wafer characteristics is determined. In one embodiment, the treatment parameter is chosen based on the wafer characteristic. At block 504 a correlation between the response and the treatment parameters is established based on the process window. In one embodiment, a calibration curve is selected from the plurality of calibration curves stored in the memory based at least on the process window, as described in further detail below.

Figure 6:
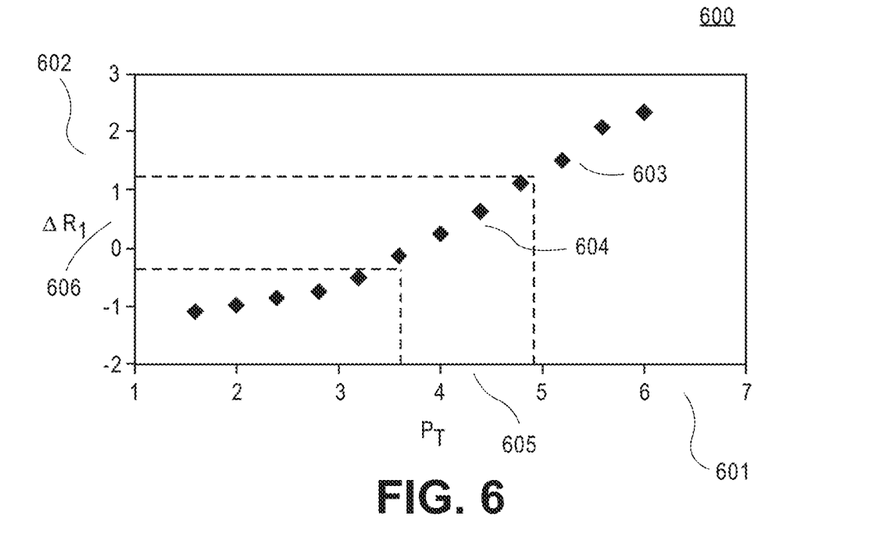
FIG. 6 is a view showing an exemplary calibration curve according to one embodiment.

FIG. 6 is a view 600 showing an exemplary calibration curve 603 according to one embodiment. Calibration curve 603 is a local stress parameter modulation sensitivity curve. In one embodiment, calibration curve 603 is a stress correction calibration curve. Calibration curve 603 shows a change (Δ) of a local stress parameter R1 601 as a function of a treatment parameter $P_T$ 607 associated with a wafer exposure to a light. In one non-limiting embodiment, the local stress parameter R1 is a local wafer curvature ($mm^{-1}$). In another embodiment, the local stress parameter R1 is a parameter associated with an optical, thermal, chemical or mechanical property or any combination thereof. In one embodiment, the change (Δ) of the local stress parameter R1 represents a difference between the local stress parameter of the treated wafer and the local stress parameter of the untreated wafer.

In one embodiment, the treatment parameter $P_T$ is a fluence ($mJ/cm^2$). In alternative embodiments, the treatment parameter $P_T$ is a dose, a power, a fluence, a pulse width, a beam shape, a beam size, a wavelength, an exposure repetition rate, an exposure time, a scan speed, a number of flashes, a zone temperature, an ambient condition, an exposure mode, an exposure sequence, an exposure pattern, or any combination thereof. As shown in FIG. 6, a process window 604 is determined using calibration curve 603. The process window indicates a range 605 of the treatment parameter values to provide a range 606 of response changes.

In one embodiment, the size of the process window is determined based on one or more wafer characteristics (e.g., film thickness, optical and thermal properties, deposition conditions and other wafer characteristics). In one embodiment, the calibration curve for an incoming wafer is selected from the plurality of calibration curves based on the process window. In one embodiment, the calibration curve having the largest process window is selected from the plurality of the calibration curves for the wafer. In one embodiment, a treatment condition is selected for the wafer based on the wafer quality and the size of the process window.

Figure 7:
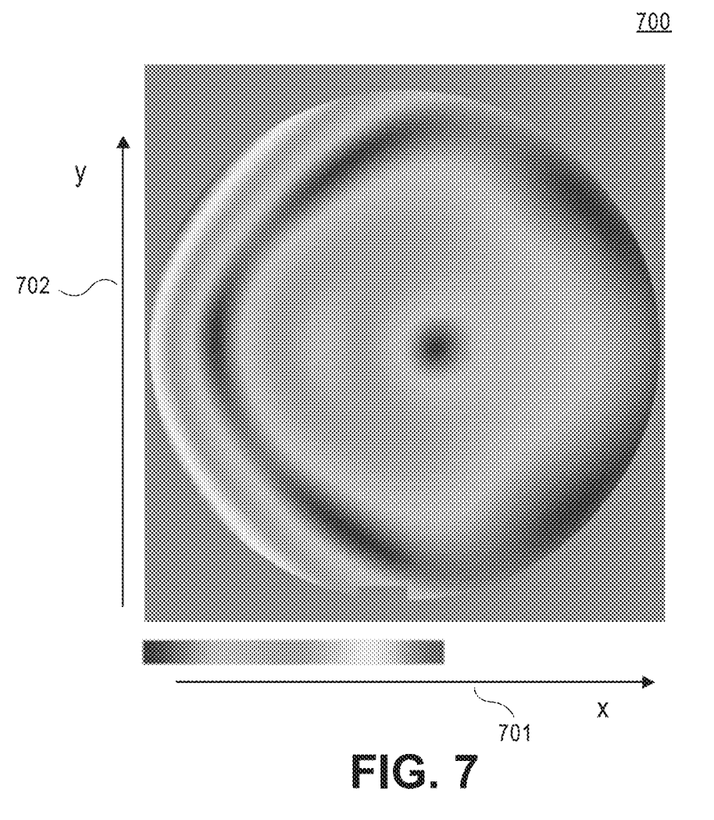
FIG. 7 is a view showing an initial local stress parameter map of the wafer according to one embodiment.

Referring back to FIG. 1, at block 102 the local stress parameter of the incoming wafer is measured. In one embodiment, the local stress parameter map is generated based on the measurement. FIG. 7 is a view showing an initial local stress parameter map 700 of the incoming wafer according to one embodiment. As shown in FIG. 7, the local stress parameter of the wafer varies along an X axis 701 and an Y axis 702. In one embodiment, the local stress parameter is a local stress curvature. Referring back to FIG. 1, at block 103 an overlay error is determined based on the local stress parameter of the wafer.

In one embodiment, the overlay error map is computed based on the local stress parameter map. In more specific embodiment, the overlay error map is computed based on the local stress curvature map. In one embodiment, the information obtained from the local curvature map, local stress map, or both is used to compute an overlay error map. In one embodiment, a mean plus 3 sigma (σ) overlay error (residual overlay) along each of X and Y axes is computed based on the initial local stress parameter map. In one non-limiting example, the residual overlay computed based on the initial local stress parameter map 700 along X axis is about 15 nm and along Y axis is about 13 nm. In one embodiment, the residual overlay is computed using linear scanner correction terms. In another embodiment, the residual overlay is computed using non-linear or higher order terms.

Figure 8:
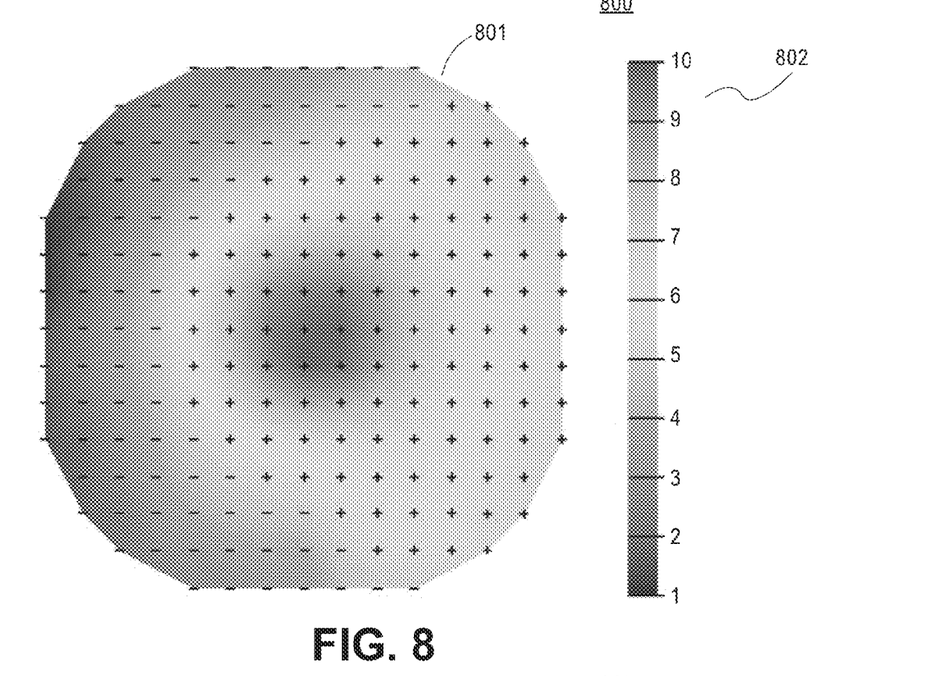
FIG. 8 is a view showing a wafer treatment map according to one embodiment.

Referring back to FIG. 1, at block 104 a treatment map for the incoming wafer is computed based on the selected calibration curve to correct the overlay error for the incoming wafer. FIG. 8 is a view showing a full wafer treatment map 800 according to one embodiment. The wafer treatment map represents a treatment parameter 802 as a function of a location on the wafer 801. In one embodiment, the full wafer map for the treatment of the incoming wafer is determined using the calibration curve and the overlay error map. At block 105 the incoming wafer is processed using the treatment map. In one embodiment, the incoming wafer is treated using a location dependent exposure to the light to reduce variations of the local stress curvature of the wafer. In one embodiment, the treatment parameter to expose the first wafer to the light is controlled using the first treatment map.

Figure 10:
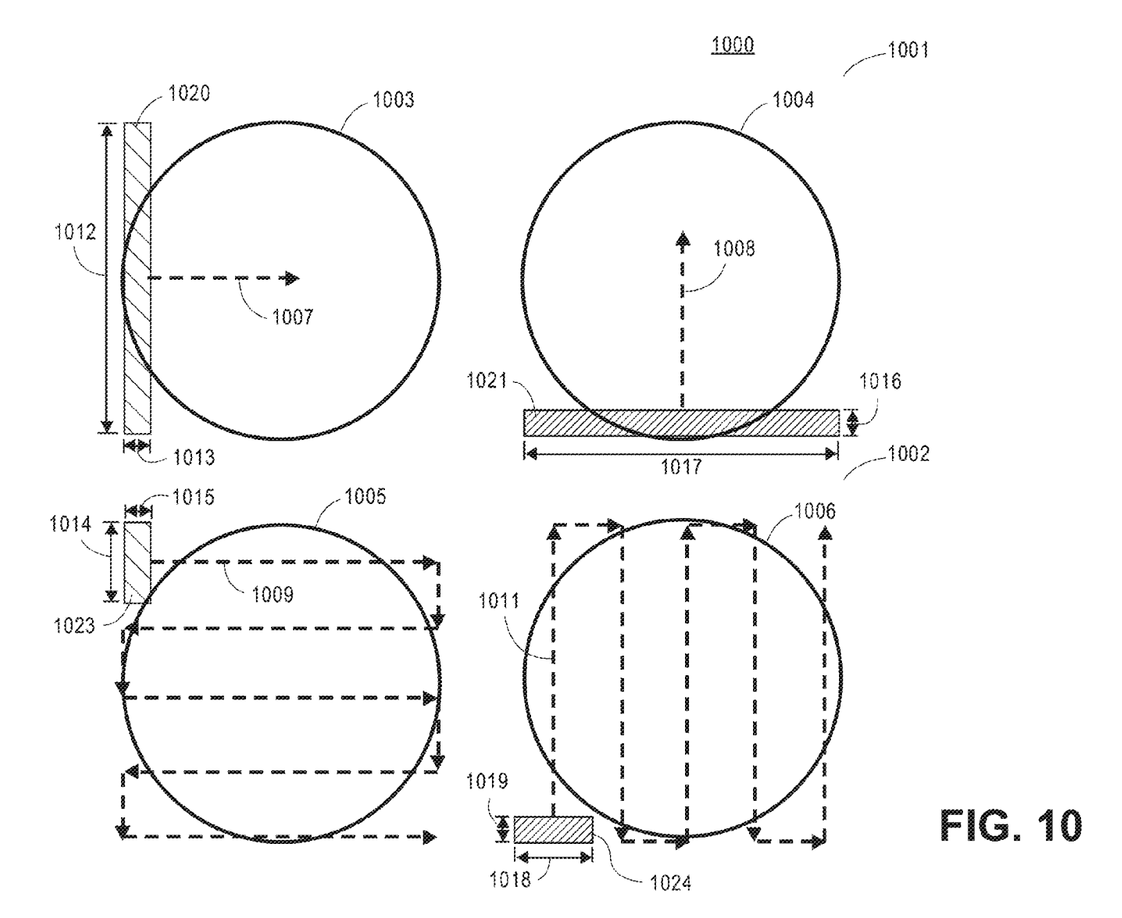
FIG. 10 is a view showing exemplary continuous light scanning modes to process a wafer to correct an overlay error according to one embodiment.

FIG. 10 is a view 1000 showing exemplary continuous light scanning modes 1001 to process an incoming wafer to correct the overlay error according to one embodiment. A continuous light scanning mode 1003 involves performing one or more sequential directional scans of a light beam 1020 along an X axis 1007 (X-scan) over the wafer. The light beam 1020 has a length 1012 and a width 1013, as shown in FIG. 10. In one embodiment, the width 1013 determines a resolution of the scan. In one embodiment, the width 1013 is from about few microns to about few centimeters. In more specific embodiment, the width 1013 is about 125 microns. In one embodiment, the length 1012 is greater than the diameter of the wafer. In one embodiment, the length 1012 is from about few microns to about few centimeters.

A continuous light scanning mode 1005 involves performing one or more sequential directional raster scans of a light beam 1023 along an X direction 1009 (X-scan) over the wafer. As shown in FIG. 10, the width 1015 of the light beam 1023 determines a resolution of the scan. In one embodiment, the width 1015 is similar to the width 1013. In one embodiment, the length 1014 of the light beam 1023 is smaller than the diameter of the wafer. In one embodiment, the length 1014 is from about few microns to about few centimeters. In one embodiment, each of the scanning modes 1003 and 1005 is used to change a local stress curvature component ($R_y$) of the wafer along an Y axis. In one embodiment, the Y axis is substantially perpendicular to the X axis.

A continuous light scanning mode 1004 involves performing sequential directional scans of a light beam 1021 along an Y direction 1008 (Y-scan) over the wafer. In one embodiment, a length 1017 and a width 1016 of the light beam 1021 are similar to that of light beam 1020. A continuous light scanning mode 1006 involves performing sequential directional raster scans of a light beam 1024 along an Y direction 1011 (Y-scan) over the wafer. In one embodiment, a length 1018 and a width 1019 of the light beam 1024 are similar to that of light beam 1023. In one embodiment, each of the scanning modes 1004 and 1006 are used to change a local stress curvature component of the wafer along an X direction ($R_x$).

In one embodiment, each of the light beams 1020, 1021, 1023 and 1024 represents a single laser beam, or other single light beam. In another embodiment, each of the light beams 1020, 1021, 1023 and 1024 represents a plurality of laser beams, or other light beams.

Figure 11:
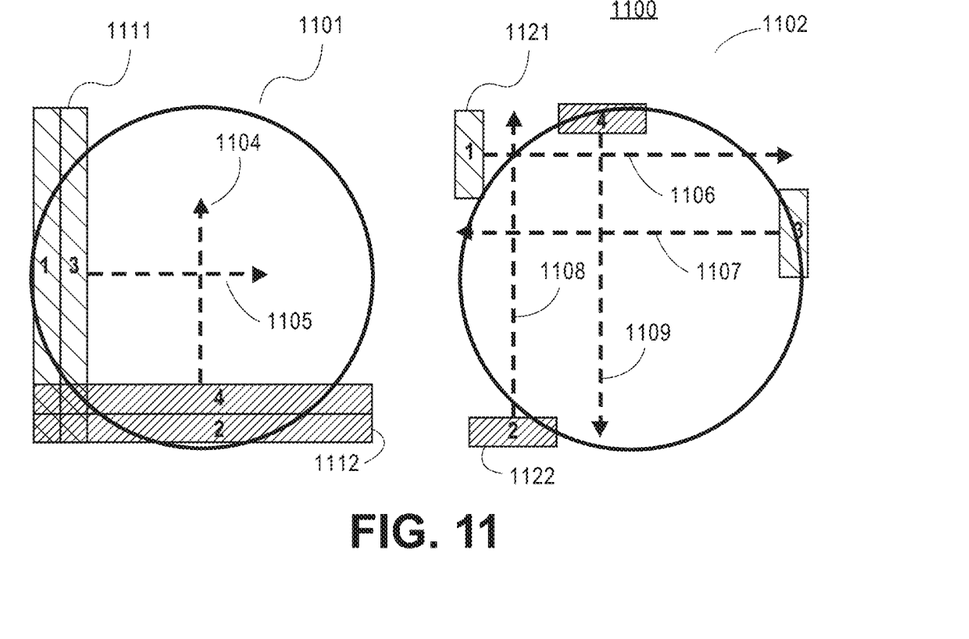
FIG. 11 is a view showing exemplary continuous light scanning modes to process the wafer to correct an overlay error according to another embodiment.

FIG. 11 is a view 1100 showing exemplary continuous light scanning modes to process the incoming wafer to correct the overlay error according to another embodiment. A continuous light scanning mode 1101 involves performing sequential directional scans (e.g., 1, 3) of a light beam 1111 along an X axis 1105 (X-scans) and directional scans (e.g., 2, 4) of a light beam 1112 along an Y axis 1105 (Y-scan).

As shown in FIG. 11, mode 1101 involves a sequence of scans 1104 X (1), 1105 Y(2), 1104 X(3), and 1105 Y(4) of light beams 1111 and 1112 respectively. In one embodiment, the length and the width of the light beams 1111 and 1112 are similar to that of light beam 1020. A continuous scanning mode 1102 involves performing sequential directional scans (e.g., 1, 3) of a light beam 1121 along an X axis in one direction 1106 and along the X axis in an opposite direction 1107 (X-scans) and directional scans (e.g., 2, 4) of a light beam 1122 along an Y axis in one direction 1108 and along the Y axis in an opposite direction 1109 (Y-scans). As shown in FIG. 11, mode 1102 involves a sequence X (1)-Y(2)-X (3)-Y(4) of scans 1106, 1108, 1107, and 1109 of light beams 1121 and 1122.

In one embodiment, the length and the width of the light beams 1121 and 1122 are similar to that of laser beam 1023. In one embodiment, each of the light beams 1111, 1112, 1121 and 1122 represents a single laser beam, or other single light beam. In another embodiment, each of the light beams 1111, 1112, 1121 and 1122 represents a plurality of laser beams, or other light beams. In one embodiment, the treatment parameter $P_T$ of the light (e.g., a dose, power, fluence) is changed along the scanning of the light. In one embodiment, for each of the continuous scanning modes described above with respect to FIGS. 10 and 11, the treatment parameter $P_T$ of the light (e.g., a dose, power, fluence, or other treatment parameter) is changed along the scanning of the light based on the wafer treatment map.

Figure 12:
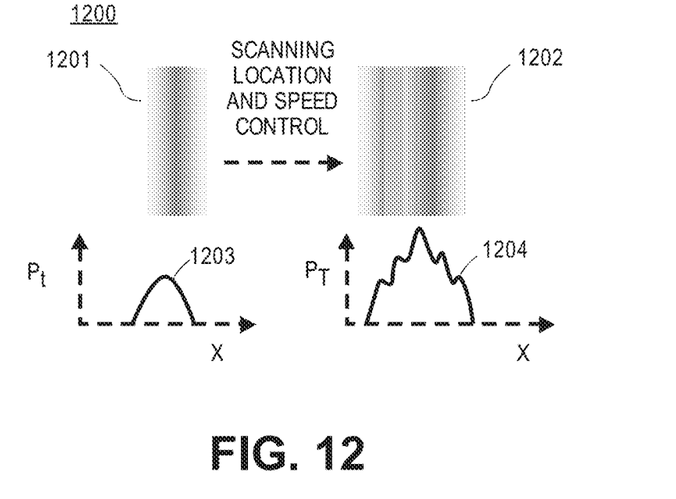
FIG. 12 is a view showing exemplary light scanning modes to process the wafer to correct an overlay error according to another embodiment.

FIG. 12 is a view 1200 showing exemplary light scanning modes to process an incoming wafer to correct the overlay error according to another embodiment. As shown in FIG. 12, a scanning mode 1201 involves a single exposure of the wafer to a light beam having the light dose controlled as a function of a location on the wafer. The scanning mode 1201 is represented by curve 1203 that shows a fluence, or power $P_T$ distribution of a laser beam 1201 as a function of a location x on the wafer. In one embodiment, the light beam 1201 represents a single laser beam, or other single light beam. In another embodiment, light beam 1201 represents a plurality of laser beams, or other light beams with stitching. The scanning mode 1201 can be used to correct overlay error over a region of the wafer from about few microns to about few centimeters.

A scanning mode 1202 involves using a superimposed grey scaling to deliver a location dependent dose of light to the wafer and improve throughput. For scanning mode 1202, a scanning location and a scanning speed are controlled. Scanning mode 1202 is represented by a curve 1204 that shows a fluence, or power $P_T$ distribution of the grey level output as a function of a location x on the wafer.

Figure 13A:
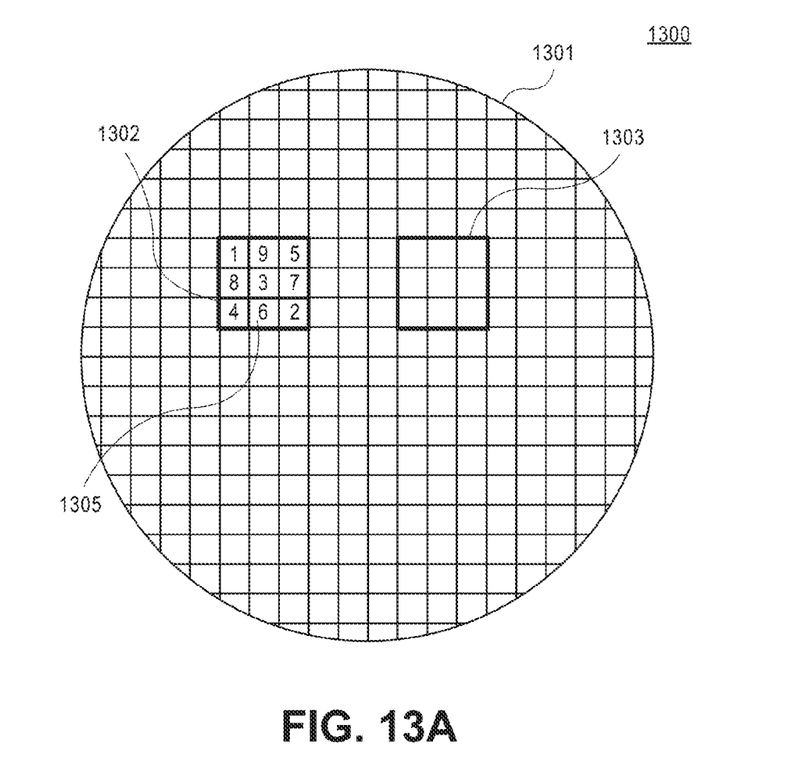
FIG. 13A is a view showing a wafer that is treated using a discontinuous exposure mode to correct an overlay error according to one embodiment.

FIG. 13A is a view 1300 showing a wafer that is treated using a discontinuous (ON and OFF) exposure mode to correct an overlay error according to one embodiment. Generally, for the discontinuous (ON and OFF) exposure mode, a location dependent light dose delivery can be achieved using different beam sizes, a fluence of the light and a location on the wafer control with a stitching overlap e.g., to correct an overlay area of about few microns to few centimeters, and treating the wafer in the form of a grid divided into unit cells and sub-cells, or any combination thereof. In one embodiment, for the ON and OFF exposure an exposure pattern is used to control a wafer quality and correct an overlay error.

In one embodiment, the overlap between consecutive exposures is minimized to improve overlay error correction performance. In one embodiment, the overlap between consecutive exposures is minimized using a predetermined exposure sequence. In one embodiment, an exposure sequence determination is based on a light beam size, a unit cell and sub-cell design and throughput considerations. In one embodiment, single or multiple pulses of the light with a even temporal distribution, an un-even temporal distribution, or any combination thereof are delivered to a single sub-cell based on the wafer and overlay requirements.

As shown in FIG. 13, the wafer is associated with a grid 1301 that is divided to a plurality of unit cells, e.g., a unit cell 1302 and a unit cell 1303. Each unit cell is divided into a plurality of sub-cells, such as a sub-cell 1305. In one embodiment, each unit cell comprises a N×N sub-cells, where N is any number, excluding zero. In one embodiment, each unit cell comprises at least 3×3 sub-cells. In one embodiment, the size of the sub-cell is substantially similar to the size of the light beam.

Figure 13B:
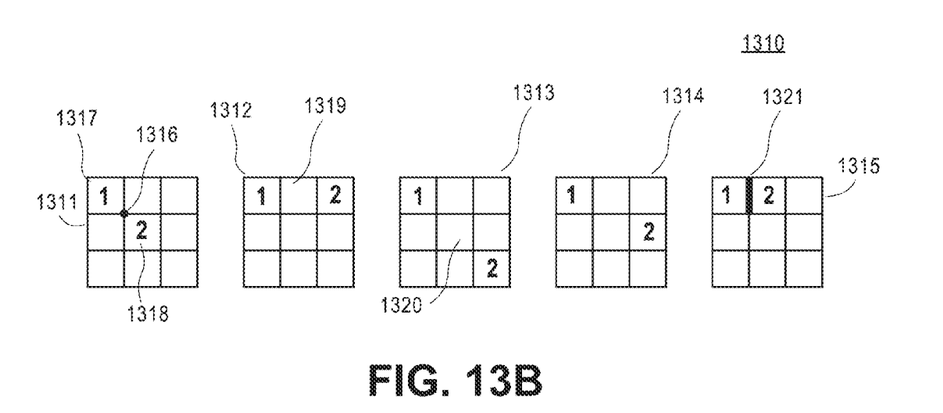
FIG. 13B is a view showing exemplary exposure sequences according to one embodiment.

FIG. 13B is a view 1310 showing exemplary exposure sequences using the grid shown in FIG. 13A according to one embodiment. Each of the unit cells 1311, 1312, 1313, 1314, and 1315 can represent unit cell 1302. In one embodiment, to change both X and Y components of the local stress parameter and avoid a directional bias, the wafer is exposed to the light in the discontinued (ON and OFF) mode according to a predetermined pattern. This pattern is created to treat both X and Y components of the local stress curvature to avoid a directional bias of the local stress parameter of the wafer. In one embodiment, an overlap between consecutive exposures of the wafer is minimized.

As shown in FIG. 13B, a pattern represented at unit cell 1311 involves moving a light beam pulse from a sub-cell 1317 (1) to a sub-cell 1318 (2). This pattern is a valid pattern, as an overlap 1316 between the first (1) and next (2) exposures on the wafer is minimized to a dot. A pattern represented at unit cell 1312 involves moving a light beam pulse from one sub-cell (1) to a next sub-cell (2) horizontally. This pattern is a valid pattern, as a first (1) and a next (2) light beam exposures on the wafer are separated by a sub-cell 1319, so that the consecutive exposures do not overlap.

A pattern represented at unit cell 1313 involves moving a light beam pulse from a sub-cell 1 to a sub-cell 2 diagonally. This pattern is a valid pattern, as the first (1) and next (2) light beam locations on the wafer are separated by a sub-cell 1320, so that there is no overlap between the consecutive exposures. A pattern represented at unit cell 1314 involves moving a light beam pulse from a sub-cell 1 to a next sub-cell 2. This pattern is a valid pattern, as the sub-cell 1 and sub-cell 2 of the unit cell 1314 are not adjacent sub-cells, so that the consecutive exposures do not overlap. A pattern represented at unit cell 1315 involves moving a light beam from a sub-cell 1 to an adjacent sub-cell 2. This pattern is an invalid pattern, as there is a substantial overlap 1312 between the consecutive exposures.

Returning back to FIG. 13A, a pattern involving a sequence of light exposures 1, 2, 3, 4, 5, 6, 7, 8, and 9 is a valid pattern, as an overlap between consecutive exposures is minimized. In one embodiment, the unit cells 1302 and 1303 are exposed to light pulses at the same time. In another embodiment, the unit cells 1302 and 1303 are exposed to light pulses at different times. In one embodiment, the unit cells 1302 and 1303 are exposed to light using a similar sequence pattern. In another embodiment, the unit cells 1302 and 1303 are exposed to light pulses using different sequence patterns. In another embodiment, light exposure sequence of unit cells 1302 and 1303 are carried out alternatively such as light exposure 1 of unit cell 1302 followed by light exposure 1 of unit cell 1303, followed by light exposure 2 of unit cell 1302 followed by light exposure 2 of unit cell 1303 and so on. After processing the wafer, the wafer quality can be re-assessed and if needed the wafer can be reprocessed for further improvement.

Referring back to FIG. 1, at block 106 the local stress parameter of the wafer is re-measured, as described above. At block 107 an overlay error map is determined based on the re-measured local stress parameter, as described above. At block 108, a determination is made if the overlay error is greater than a predetermined threshold. If the overlay error is above the predetermined threshold, at block 109 a treatment map for the wafer is computed based on the overlay error map computed at block 107. At block 110 the wafer is processed by controlling the treatment parameter using the treatment map computed at block 109, and method 100 returns to block 106. If the overlay error is not greater than the predetermined threshold method 100 ends at block 111.

Figure 9:
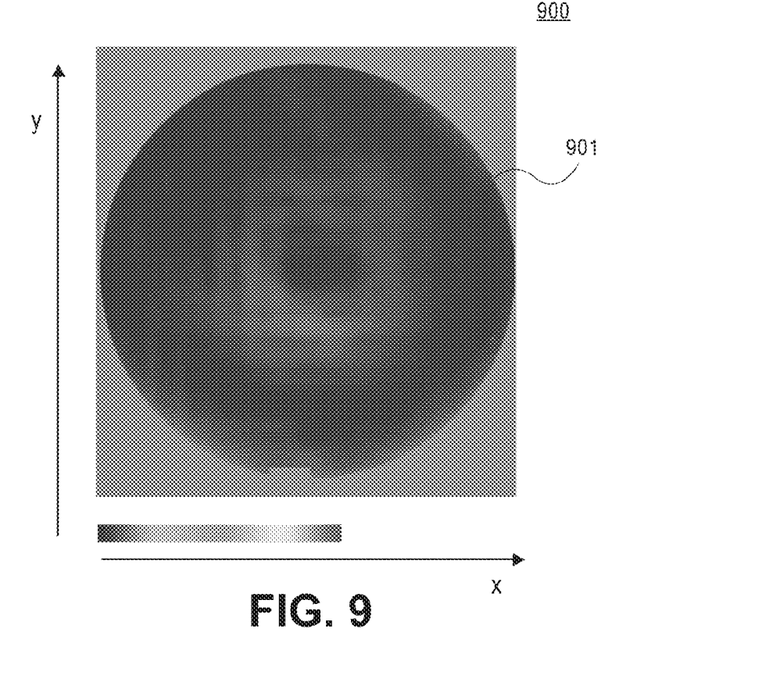
FIG. 9 is a view showing a local stress parameter map of the wafer after the light treatment according to one embodiment.

FIG. 9 is a view 900 showing a local stress parameter map 901 of the wafer after the light treatment according to one embodiment. As shown in FIG. 9, the local stress parameter of the wafer is substantially the same along an X axis and an Y axis. In one embodiment, the local stress parameter map 901 is a local stress curvature map. In one embodiment, the overlay error map is computed based on the local stress parameter map 901. In one embodiment, the information obtained from the local curvature map, local stress map, or both is used to compute the overlay error map. In one non-limiting example, the residual overlay computed based on the local stress parameter map 901 along X axis is about 1.44 nm and along Y axis is about 1.98 nm that is substantially less comparing to the initial overlay error of the wafer before light treatment. That is, embodiments of the treatment of the wafer using light as described herein demonstrate the overlay error correction of more than 80 percent.

Figure 14:
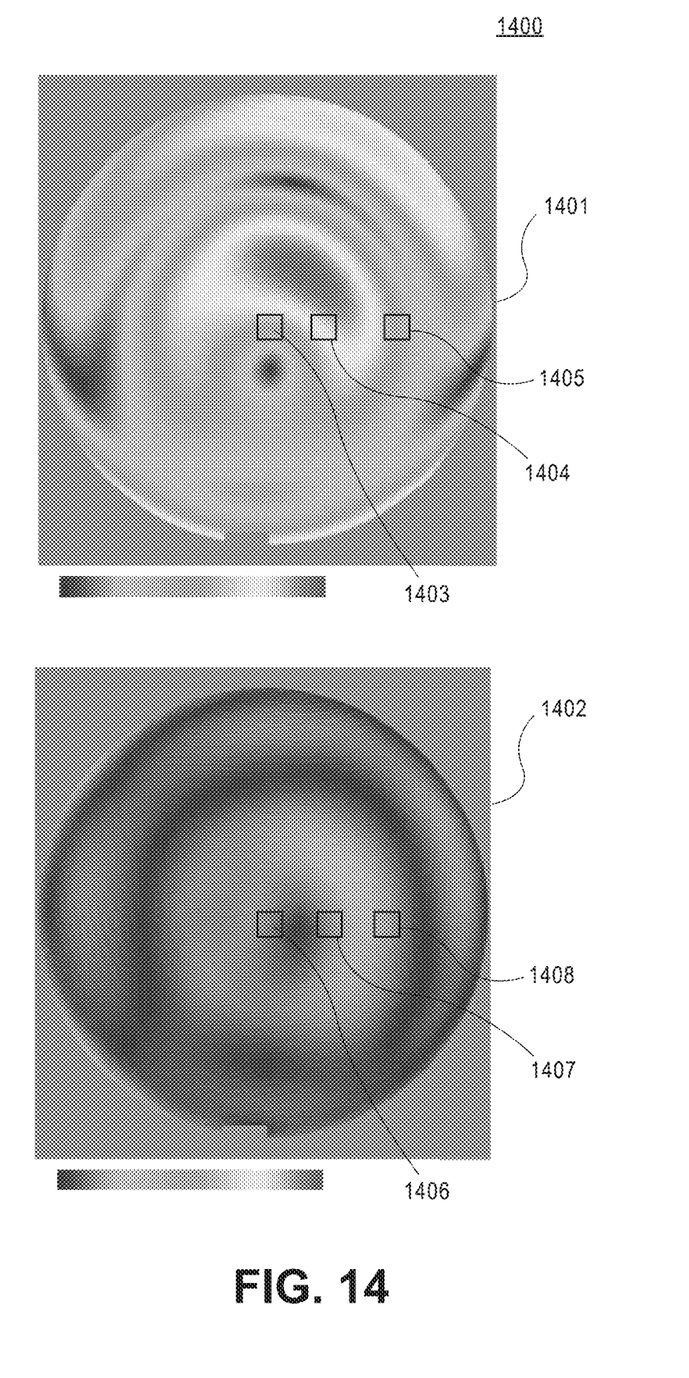
FIG. 14 is a view showing local stress parameter maps of the wafer before and after a laser treatment according to one embodiment.

FIG. 14 is a view 1400 showing a local stress parameter map of the wafer before laser treatment 1401 and a local stress parameter map of the wafer after laser treatment 1402 according to one embodiment. In one embodiment, a residual overlay along each of X and Y axes is computed at a center portion 1403, a middle portion 1404 and at an edge portion 1401 of the wafer based on the local stress parameter map 1401. In one embodiment, the residual overlay is computed using linear scanner correction terms. In another embodiment, the residual overlay is computed using non-linear or higher order terms. In one non-limiting example, the residual overlay of the wafer before laser treatment along X axis at the center portion is about 5 nm, at the middle portion is about 9 nm and at the edge portion is about 6 nm. In one non-limiting example, the residual overlay of the wafer before laser treatment along Y axis at the center portion is about 9.5 nm, at the middle portion is about 5.5 nm and at the edge portion is about 2.5 nm.

In one embodiment, a residual overlay along each of X and Y axes is computed at a center portion 1406, a middle portion 1407 and at an edge portion 1408 of the wafer based on the local stress parameter map 1402. In one non-limiting example, the residual overlay of the wafer after laser treatment along X axis at the center portion is about 2 nm, at the middle portion is about 2.5 nm and at the edge portion is about 2 nm. In one non-limiting example, the residual overlay of the wafer after laser treatment along Y axis at the center portion is about 1.5 nm, at the middle portion is about 1.3 nm and at the edge portion is about 0.43 nm. That is, the overlay error of the wafer is minimized using the laser treatment at intra litho die resolution.

In one embodiment, the laser induced overlay error correction is performed on wafers that have been processed in different processing chambers. Typically, the wafers that have been processed in different processing chambers have different overlay error patterns (signatures). The laser induced overlay error correction substantially matches the chamber-to-chamber overlay error signatures. In one embodiment, the laser induced overlay error correction reduces the chamber-to-chamber difference in overlay error signatures to less than 30%.

Figure 15:
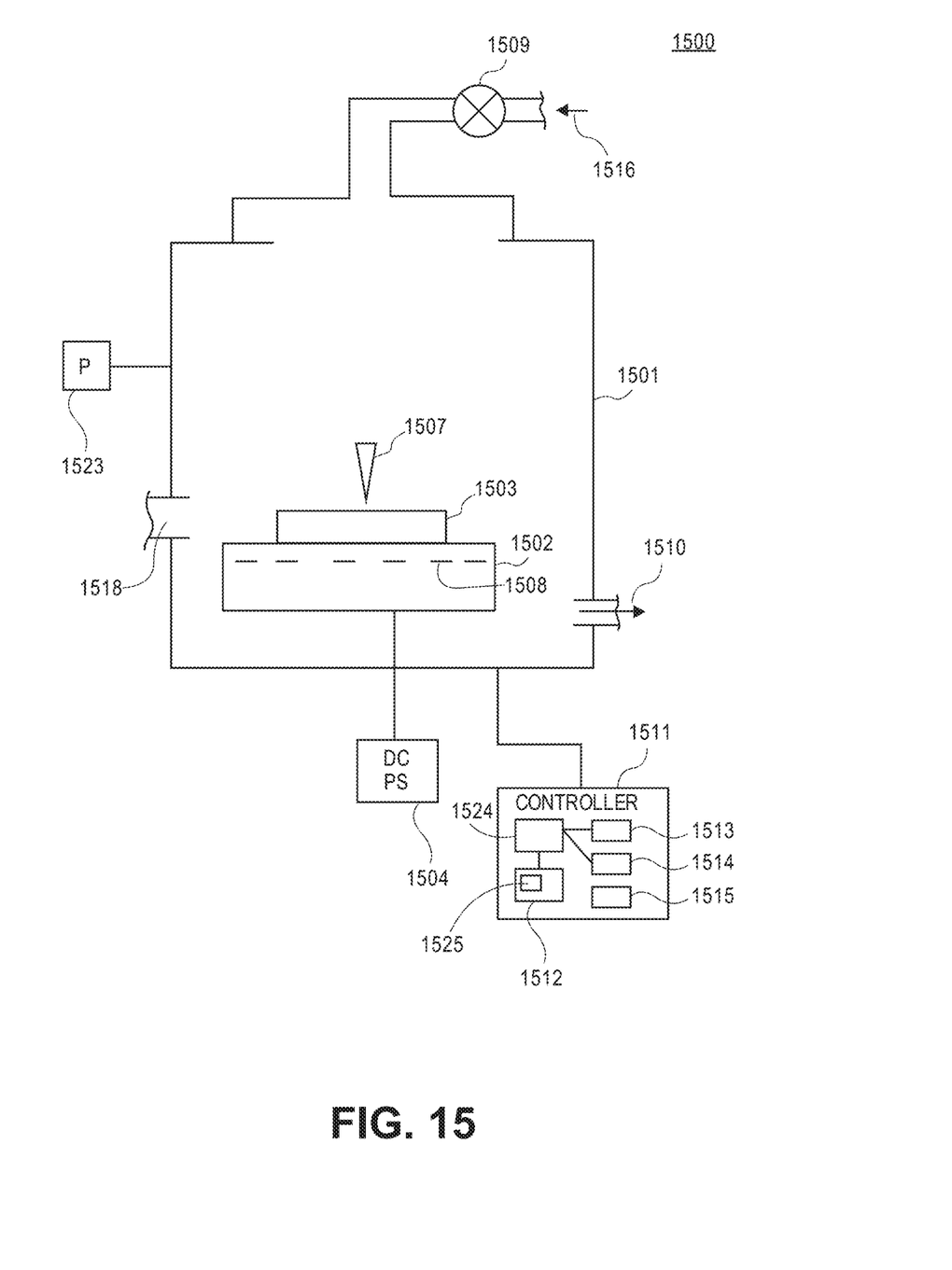
FIG. 15 shows a block diagram of a processing system to perform methods of light induced overlay error correction according to one embodiment.

FIG. 15 shows a block diagram of an embodiment of a processing system 1500 to perform methods of light induced overlay error correction, as described above. As shown in FIG. 15, system 1500 has a processing chamber 1501. A movable pedestal 1502 to hold a wafer 1503 is in processing chamber 1501. Pedestal 1502 comprises an electrostatic chuck ("ESC"), a DC electrode 1508 embedded into the ESC, and a cooling/heating base. A DC power supply 1504 is connected to the DC electrode 1508 of the pedestal 1502. A light 1507 is supplied to the wafer 1503, as described above. Wafer 1503 is loaded through an opening 1518 and placed on pedestal 1502. Wafer 1503 represents one of the wafers described above. The processing chamber 1501 may be any type of processing chamber known in the art, such as, but not limited to chambers manufactured by Applied Materials, Inc. located in Santa Clara, Calif. Other commercially available processing chamber systems may be used to perform the methods as described herein.

System 1500 comprises an inlet to input one or more process gases 1516 through a mass flow controller 1509 to chamber 1501. As shown in FIG. 15, a pressure control system 1523 provides a pressure to processing chamber 1501. As shown in FIG. 15, chamber 1501 has an exhaust outlet 1510 to evacuate volatile products produced during processing in the chamber.

A control system 1511 is coupled to the chamber 1501. The control system 1511 comprises a processor 1524, a local stress parameter measuring system 1513, a light controller 1514, a memory 1512 and input/output devices 1515 to provide a light induced error correction, as described herein. Memory 1512 is configured to store one or more calibration curves, local stress parameter maps, wafer treatment maps, overlay error maps, as described above. In one embodiment, the processor 1524 has a configuration to control determining a calibration curve for a wafer, as described above. The processor 1524 has a configuration to control measuring the local parameter of the first wafer, as described above. The processor 1524 has a configuration to control determining an overlay error based on the local parameter, as described above. The processor 1524 has a configuration to control computing a treatment map based on the calibration curve to correct the overlay error for the wafer, as described above. The processor 1524 has a configuration to control the treatment parameter using the treatment map to expose the first wafer to the light, as described above.

The processor 1524 has a configuration to control measuring a response of the local parameter of a reference wafer to a plurality of treatment conditions associated with a plurality of treatment parameters, as described above. The processor 1524 has a configuration to control generating a plurality of calibration curves based on measuring, as described above. The processor 1524 has a configuration to control determining a process window for each of the calibration curves, as described above.

Processor 1524 represents one or more general-purpose processing devices such as a microprocessor, central processing unit, or other processing device. Processor 1102 may also be one or more special-purpose processing devices such as an application specific integrated circuit (ASIC), a field programmable gate array (FPGA), a digital signal processor (DSP), network processor, or the like. Processor 1524 is configured to control a processing logic for performing the operations, as described herein with respect to FIGS. 1-14.

The memory 1512 may include a machine-accessible storage medium (or more specifically a computer-readable storage medium) on which is stored one or more sets of instructions embodying any one or more of the methodologies or functions described herein. The instructions may also reside, completely or at least partially, within the processor 1524 during execution thereof by the control system 1511, the processor 1524 also constituting machine-readable storage media. The instructions may further be transmitted or received over a network via a network interface device.

It is appreciated that the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine to perform any one or more of the methodologies described herein. The term "machine-readable storage medium" shall accordingly be taken to include, but not be limited to, solid-state memories, and optical and magnetic media.

In the foregoing specification, embodiments of the invention have been described with reference to specific exemplary embodiments thereof. It will be evident that various modifications may be made thereto without departing from the broader spirit and scope of embodiments of the invention as set forth in the following claims. The specification and drawings are, accordingly, to be regarded in an illustrative sense rather than a restrictive sense.

What is claimed is:

1. A method to correct an overlay error, comprising:
    determining a first calibration curve for a first wafer comprising a first layer on a substrate, the first calibration curve representing a local parameter change as a function of a first treatment parameter associated with a wafer exposure to a light;
    measuring the local parameter of the first wafer;
    determining a first overlay error based on the local parameter; and
    computing a first treatment map based on the first calibration curve to correct the first overlay error for the first wafer, the first treatment map representing the first treatment parameter as a function of a location on the first wafer.

2. The method of claim 1, further comprising processing the first wafer using the first treatment map.

3. The method of claim 1, further comprising
    re-measuring the local parameter of the first wafer;
    determining a second overlay error based on the re-measured local parameter;
    determining if the second overlay error is greater than a predetermined threshold; and
    computing a second treatment map for the first wafer based on the second overlay error, if the second overlay error is greater than the predetermined threshold.

4. The method of claim 1, further comprising measuring a response of the local parameter of a reference wafer to a plurality of treatment conditions associated with a plurality of treatment parameters;
    generating a plurality of calibration curves based on measuring;
    determining a process window for each of the calibration curves, wherein the first calibration curve is selected from the plurality of calibration curves stored in a memory based at least on the process window.

5. The method of claim 1, wherein the first layer is a mask layer, and wherein the substrate comprises a multilayer stack.

6. The method of claim 1, wherein the first calibration curve is determined based on a characteristic of the first wafer.

7. The method of claim 1, wherein the first treatment parameter comprises a dose, a power, a fluence, a pulse width, a beam shape, a beam size, a wavelength, an exposure repetition rate, an exposure time, a scan speed, a number of flashes, a zone temperature, an ambient condition, an exposure mode, an exposure sequence, an exposure pattern, or any combination thereof.

8. The method of claim 1, wherein the local parameter comprises a local stress curvature.

9. A non-transitory machine readable medium comprising instructions that cause a data processing system to perform operations comprising:
    determining a first calibration curve for a first wafer comprising a first layer on a substrate, the first calibration curve representing a local parameter change as a function of a first treatment parameter associated with a wafer exposure to a light;
    measuring the local parameter of the first wafer;
    determining a first overlay error based on the local parameter; and
    computing a first treatment map based on the first calibration curve to correct the first overlay error for the first wafer.

10. The non-transitory machine readable medium of claim 9, further comprising instructions that cause the data processing system to perform operations comprising processing the first wafer using the first treatment map.

11. The non-transitory machine readable medium of claim 9, further comprising instructions that cause the data processing system to perform operations comprising re-measuring the local parameter of the first wafer;
    determining a second overlay error based on the re-measured local parameter;
    determining if the second overlay error is greater than a predetermined threshold; and
    computing a second treatment map for the first wafer based on the second overlay error, if the second overlay error is greater than the predetermined threshold.

12. The non-transitory machine readable medium of claim 9, further comprising instructions that cause the data processing system to perform operations comprising measuring a response of the local parameter of a reference wafer to a plurality of treatment conditions associated with a plurality of treatment parameters;
    generating a plurality of calibration curves based on measuring;
    determining a process window for each of the calibration curves, wherein the first calibration curve is selected from the plurality of calibration curves stored in a memory based at least on the process window.

13. The non-transitory machine readable medium of claim 9, wherein the first layer is a mask layer, and wherein the substrate comprises a multilayer stack.

14. The non-transitory machine readable medium of claim 9, wherein the first calibration curve is determined based on a characteristic of the first wafer.

15. The non-transitory machine readable medium of claim 9, wherein the first treatment parameter comprises a dose, a power, a fluence, a pulse width, a beam shape, a beam size, a wavelength, an exposure repetition rate, an exposure time, a scan speed, a number of flashes, a zone temperature, an ambient condition, an exposure mode, an exposure sequence, an exposure pattern, or any combination thereof.

16. The non-transitory machine readable medium of claim 9, wherein the local parameter comprises a local wafer curvature.

* * * * *